(12) United States Patent
Koyamada et al.

(10) Patent No.: US 11,085,970 B2
(45) Date of Patent: Aug. 10, 2021

(54) SECONDARY BATTERY DEGRADATION STATE ESTIMATION METHOD, DEGRADATION STATE ESTIMATION DEVICE, CONTROL METHOD, AND CONTROL SYSTEM

(71) Applicant: TOYOTA JIDOSHA KABUSHIKI KAISHA, Toyota (JP)

(72) Inventors: Kohei Koyamada, Susono (JP); Masafumi Nose, Susono (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 328 days.

(21) Appl. No.: 16/408,638

(22) Filed: May 10, 2019

(65) Prior Publication Data

US 2019/0361076 A1 Nov. 28, 2019

(30) Foreign Application Priority Data

May 23, 2018 (JP) .............................. JP2018-098662

(51) Int. Cl.
*H02J 7/00* (2006.01)
*G01R 31/392* (2019.01)
*G01R 31/36* (2020.01)
*G01R 31/396* (2019.01)
*H01M 10/46* (2006.01)
*H01M 10/48* (2006.01)
*H01M 10/52* (2006.01)
*H01M 10/052* (2010.01)

(52) U.S. Cl.
CPC ....... *G01R 31/392* (2019.01); *G01R 31/3648* (2013.01); *G01R 31/396* (2019.01);
(Continued)

(58) Field of Classification Search
CPC .............. G01R 31/392; G01R 31/3648; G01R 31/396; H01M 10/46; H01M 10/482; H01M 10/052; H01M 10/486; H02J 7/0068
(Continued)

(56) References Cited

U.S. PATENT DOCUMENTS 10,976,370 B2* 4/2021 Furukawa ................ H02J 7/00
2010/0250163 A1* 9/2010 Maegawa .......... G01R 31/3842
702/63
(Continued)

FOREIGN PATENT DOCUMENTS

JP 2007-311256 A 11/2007
JP 2012-208027 A 10/2012
JP 2016-058245 A 4/2016

*Primary Examiner* — Phallaka Kik
(74) *Attorney, Agent, or Firm* — Sughrue Mion, PLLC

(57) ABSTRACT

A method for estimating, under total voltage monitoring, degradation states of individual unit cells connected in series of an all-solid-state lithium secondary battery includes: calculating, at several timings, a state of charge and open circuit voltage of the battery to acquire an actual state of charge-open circuit voltage curve representing the relationship between the state of charge and the open circuit voltage, selecting, from a map of state of charge-open circuit voltage curves, a curve for which a degree of matching with the actual state of charge-open circuit voltage curve is equal to or greater than a predetermined value or is greatest. The map curves are obtained by integrating as many state of charge-open circuit voltage curves of the unit cell corresponding to different degrees of degradation of the unit cell as the number of unit cells, and estimating the individual unit cells degradation states based on the selected curve.

14 Claims, 7 Drawing Sheets

(52) U.S. Cl.
CPC ......... *H01M 10/052* (2013.01); *H01M 10/46* (2013.01); *H01M 10/482* (2013.01); *H01M 10/486* (2013.01); *H02J 7/0068* (2013.01)

(58) Field of Classification Search
USPC .................. 320/132, 134, 136, 157, 162
See application file for complete search history.

(56) References Cited

U.S. PATENT DOCUMENTS

| | | | |
|---|---|---|---|
| 2014/0214347 A1* | 7/2014 | Laskowsky | G01R 31/3842 702/63 |
| 2015/0253389 A1* | 9/2015 | Arai | G01R 31/3648 324/427 |
| 2015/0357852 A1* | 12/2015 | Nakao | G01R 31/3842 320/162 |
| 2016/0049821 A1* | 2/2016 | Aridome | G01R 31/3648 320/128 |
| 2016/0363630 A1* | 12/2016 | Laskowsky | G01R 31/382 |
| 2017/0146609 A1* | 5/2017 | Uchino | H01M 10/486 |
| 2017/0146610 A1* | 5/2017 | Cha | G01R 31/3835 |
| 2017/0261560 A1 | 9/2017 | Goto | |
| 2017/0282745 A1* | 10/2017 | Kawamura | B60L 58/13 |
| 2017/0285109 A1* | 10/2017 | Kawamura | H02J 7/1423 |
| 2017/0363690 A1* | 12/2017 | Kawamura | G01R 31/382 |
| 2020/0018798 A1* | 1/2020 | Ukumori | G01R 31/3842 |
| 2020/0033415 A1* | 1/2020 | Furukawa | G01R 31/36 |
| 2020/0041574 A1* | 2/2020 | Ukumori | H02J 7/00 |
| 2021/0103000 A1* | 4/2021 | Fujino | H01M 10/48 |

\* cited by examiner

FIG. 1

| DEGREE OF DEGRADATION 0% | | DEGREE OF DEGRADATION 10% | | DEGREE OF DEGRADATION 20% | | DEGREE OF DEGRADATION 30% | | ... | |
|---|---|---|---|---|---|---|---|---|---|
| OCV/V | SOC/% | OCV/V | SOC/% | OCV/V | SOC/% | OCV/V | SOC/% | OCV/V | SOC/% |
| 3.0 | 0 | 3.0 | 0 | 3.0 | 0 | 3.0 | 0 | ... | ... |
| 3.5 | 8 | 3.5 | 7 | 3.5 | 6 | 3.5 | 5 | ... | ... |
| 3.5 | 16 | 3.5 | 14 | 3.5 | 11 | 3.5 | 11 | ... | ... |
| 3.6 | 23 | 3.6 | 21 | 3.6 | 17 | 3.6 | 16 | ... | ... |
| 3.7 | 31 | 3.7 | 28 | 3.7 | 23 | 3.7 | 22 | ... | ... |
| 3.7 | 39 | 3.7 | 35 | 3.7 | 28 | 3.7 | 27 | ... | ... |
| 3.8 | 47 | 3.8 | 42 | 3.8 | 34 | 3.8 | 33 | ... | ... |
| 3.8 | 55 | 3.8 | 49 | 3.8 | 39 | 3.8 | 38 | ... | ... |
| 3.9 | 63 | 3.9 | 56 | 3.9 | 45 | 3.9 | 44 | ... | ... |
| 4.0 | 70 | 4.0 | 63 | 4.0 | 51 | 4.0 | 49 | ... | ... |
| 4.1 | 78 | 4.1 | 70 | 4.1 | 56 | 4.1 | 55 | ... | ... |
| 4.2 | 86 | 4.2 | 77 | 4.2 | 62 | 4.2 | 60 | ... | ... |
| 4.3 | 94 | 4.3 | 84 | 4.3 | 68 | 4.3 | 66 | ... | ... |
| 4.4 | — | 4.4 | 91 | 4.4 | 73 | 4.4 | 71 | ... | ... |
| 4.5 | — | 4.5 | 98 | 4.5 | 79 | 4.5 | 77 | ... | ... |
| 4.5 | — | 4.5 | — | 4.5 | 84 | 4.5 | 82 | ... | ... |
| 4.6 | — | 4.6 | — | 4.6 | 90 | 4.6 | 88 | ... | ... |
| 4.6 | — | 4.6 | — | 4.6 | 96 | 4.6 | 93 | ... | ... |
| 4.7 | — | 4.7 | — | 4.7 | — | 4.7 | 98 | ... | ... |

FIG. 2

| PATTERN1 (DEGREE OF DEGRADATION 0% +DEGREE OF DEGRADATION 0% +DEGREE OF DEGRADATION 10%) | | PATTERN2 (DEGREE OF DEGRADATION 0% +DEGREE OF DEGRADATION 0% +DEGREE OF DEGRADATION 30%) | | ... | |
|---|---|---|---|---|---|
| OCV/V | SOC/% | OCV/V | SOC/% | OCV/V | SOC/% |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |

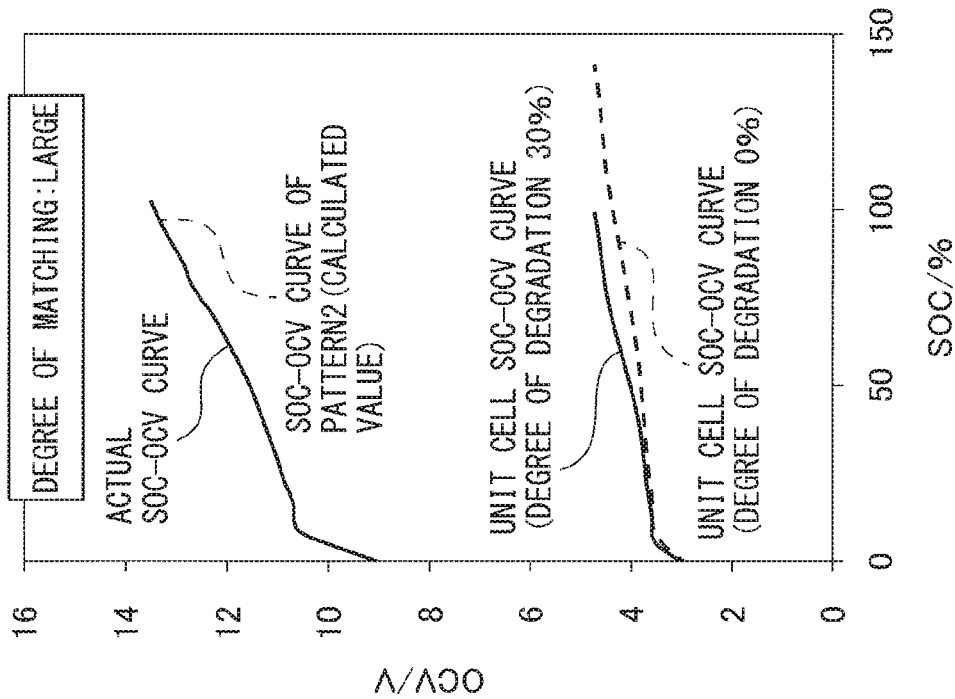
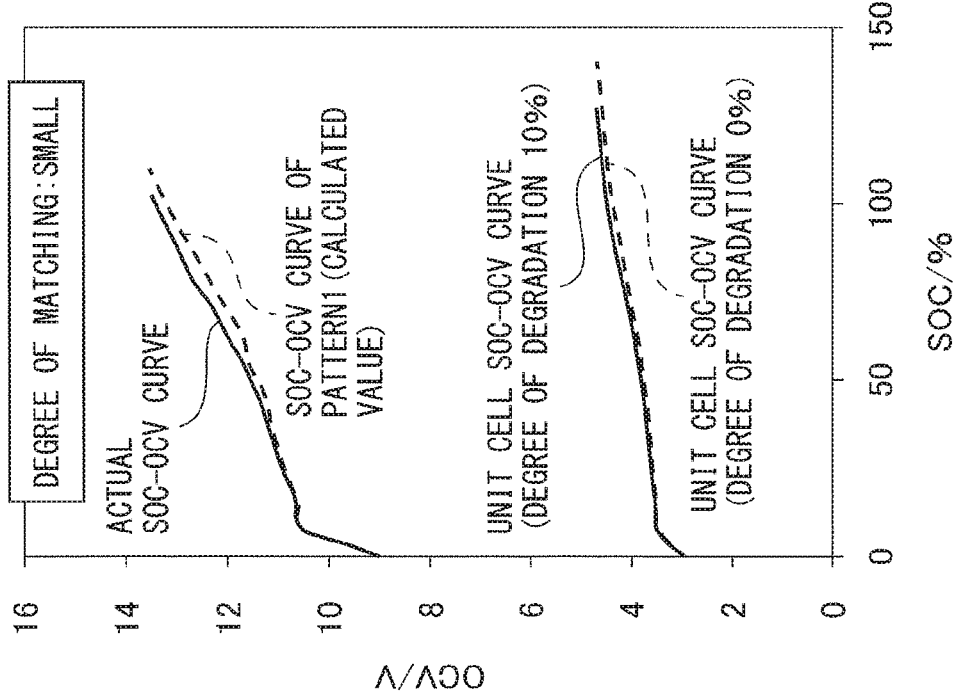

SECONDARY BATTERY DEGRADATION STATE ESTIMATION METHOD, DEGRADATION STATE ESTIMATION DEVICE, CONTROL METHOD, AND CONTROL SYSTEM

FIELD

The present disclosure relates to a secondary battery degradation state estimation method, a degradation state estimation device, a control method, and a control system.

BACKGROUND

In recent years, secondary batteries have been widely used as the power supplies of electric vehicles, the power supplies of electrical equipment, the power supplies of measurement equipment, and emergency power supplies.

Many methods for diagnosing the state of charge and degradation state of such secondary batteries have been suggested.

For example, Patent Literature 1 discloses a method for diagnosing the degradation state of a battery pack composed of a plurality of batteries during float charging. Specifically, Patent Literature 1 discloses discharging the battery pack at a current of 0.02 CA or more to obtain the difference in discharge voltage over time, and using the internal resistance of the battery obtained by dividing this difference by the discharge current to diagnose the degradation state of the battery pack.

Furthermore, Patent Literature 2 discloses a method for determining the degradation state of a battery pack. Specifically, Patent Literature 2 discloses measuring the voltage at the time of discharge of each unit cell constituting the battery pack, determining the distribution and the frequency of occurrence of deviation of the measured voltage with respect to the equipment design specification voltage, and based thereon, determining the degradation state of the battery pack.

CITATION LIST

Patent Literature

[PTL 1] Japanese Unexamined Patent Publication (Kokai) No. 2012-208027
[PTL 2] Japanese Unexamined Patent Publication (Kokai) No. 2007-311256

SUMMARY

Technical Problem

In order to charge and discharge at high voltages, secondary batteries comprising a plurality of unit cells connected in series are often used. When such a secondary battery comprising a plurality of unit cells is used, there are frequently variations in the degrees of degradation of the individual unit cells.

In the method of Patent Literature 1 or 2, it is necessary to measure the voltage and the like of the individual unit cells, but it is not possible to estimate the degradation states of the unit cells from the total voltage of the battery pack. Furthermore, by measuring the voltage for each unit cell, the device configuration and the system become complicated. When such estimation of the degradation state of individual unit cells cannot be properly performed, there is a problem that deteriorated unit cells can become over-discharged and/or overcharged, whereby further degradation is promoted.

Thus, the present disclosure provides a method and device with which the degradation states of individual unit cells of an all-solid-state lithium secondary battery comprising a plurality of unit cells connected in series can be estimated even under total voltage monitoring. Furthermore, the present disclosure provides an all-solid-state lithium secondary battery control method and system based on which the degradation states can be estimated.

Solution to Problem

The inventors of the present disclosure have discovered that the above problems can be solved by the following means.

<Aspect 1>

A method for estimating degradation states of individual unit cells of an all-solid-state lithium secondary battery comprising a plurality of unit cells connected in series, the method comprising the following steps (a) to (c):

(a) calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery, (b) selecting, from a pre-established map of state of charge-open circuit voltage curves of the all-solid-state lithium secondary battery, a state of charge-open circuit voltage curve for which a degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating the state of charge-open circuit voltage curves of the unit cell corresponding to a plurality of different degrees of degradation of the unit cell by the same number as the number of the plurality of unit cells included in the all-solid-state lithium secondary battery, and (c) estimating the degradation states of the individual unit cells based on the selected state of charge-open circuit voltage curve.

<Aspect 2>

The method according to aspect 1, wherein in step (a), the state of charge and open circuit voltage of the all-solid-state lithium secondary battery are calculated, at the plurality of timings, based on a voltage value, a current value, and a temperature of the all-solid-state lithium secondary battery to acquire the actual state of charge-open circuit voltage curve of the all-solid-state lithium secondary battery.

<Aspect 3>

The method according to aspect 1 or 2, comprising the following steps (i) and (ii) after step (c);

(i) calculating, at a plurality of timings, the state of charge and open circuit voltage of the all-solid-state lithium secondary battery to acquire the actual state of charge-open circuit voltage curve of the all-solid-state lithium secondary battery, and (ii) (ii-1) not again estimating the degradation states of the individual unit cells by the method according to aspect 1 or 2 when a degree of matching between the actual state of charge-open circuit voltage curve of the all-solid-state lithium secondary battery acquired in step (a) and the actual state of charge-open circuit voltage curve of the all-solid-state lithium secondary battery acquired in step (i) is equal to or greater than a predetermined value, and (ii-2) again estimating the degradation states of the individual unit cells by the method according to aspect 1 or 2 when the degree of matching between the actual state of charge-open circuit voltage curve of the all-solid-state lithium secondary battery acquired in step (a) and the actual state of charge-open circuit voltage curve of the all-solid-state lithium secondary battery acquired in step (i) is less than the predetermined value.

<Aspect 4>

The method according to any one of aspects 1 to 3, wherein at least one of:

the degree of matching of the actual state of charge-open circuit voltage curve of the all-solid-state lithium secondary battery from the pre-established map of the state of charge-open circuit voltage curves of the all-solid-state lithium secondary battery, and the degree of the matching between the actual state of charge-open circuit voltage curve of the all-solid-state lithium secondary battery acquired in step (a) and the actual state of charge-open circuit voltage curve of the all-solid-state lithium secondary battery acquired in step (i) is calculated according to the method of least squares.

<Aspect 5>

The method according to any one of aspects 1 to 4, wherein the plurality of unit cells connected in series form a bipolar-type laminated battery.

<Aspect 6>

The method according to any one of aspects 1 to 5, wherein the unit cells comprise a positive electrode current collector layer, a positive electrode active material layer comprising a nickel-cobalt-manganese-based positive electrode active material, a solid electrolyte layer, a negative electrode active material layer, and a negative electrode current collector layer laminated in this order.

<Aspect 7>

A method for controlling an all-solid-state lithium secondary battery including a plurality of unit cells connected in series, the method comprising obtaining the degradation state of a unit cell which is most deteriorated based on the degradation states of the individual unit cells estimated in step (c) of the method according to any one of aspects 1 to 6, and determining at least one of a charge upper limit voltage and a discharge lower limit voltage of the all-solid-state lithium battery in accordance with the thus-obtained degradation state of the unit cell which is most deteriorated.

<Aspect 8>

An estimation device for estimating the degradation states of individual unit cells of an all-solid-state lithium secondary battery comprising a plurality of unit cells connected in series, the device comprising:

a state of charge-open circuit voltage curve acquisition part for calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery, a selection part for selecting, from a pre-established map of state of charge-open circuit voltage curves of the all-solid-state lithium secondary battery, a state of charge-open circuit voltage curve for which the degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating as many state of charge-open circuit voltage curves of a unit cell corresponding to a plurality of different degrees of degradation of the unit cell as the number of the plurality of unit cells included in the all-solid-state lithium secondary battery, and an estimation part for estimating the degradation states of the individual unit cells based on the selected state of charge-open circuit voltage curve.

<Aspect 9>

The device according to aspect 8, wherein the state of charge-open circuit voltage curve acquisition part calculates, at a plurality of timings, the state of charge and open circuit voltage of the all-solid-state lithium secondary battery based on a voltage value, a current value, and a temperature of the all-solid-state lithium secondary battery at a plurality of timings to acquire the actual state of charge-open circuit voltage curve of the all-solid-state lithium secondary battery.

<Aspect 10>

The device according to aspect 8 or 9, further comprising an estimation necessity determination part, wherein the actual state of charge-open circuit voltage curve of the all-solid-state lithium secondary battery used for estimation of the degradation states of the individual unit cells by the estimation part is a first state of charge-open circuit voltage curve, after the degradation states of the individual unit cells have been estimated by the estimation part, the state of charge-open circuit voltage curve acquisition part calculates, at a plurality of timings, the state of charge and open circuit voltage of the all-solid-state lithium secondary battery to acquire a second state of charge-open circuit voltage curve, and when a degree of matching between the first state of charge-open circuit voltage curve and the second state of charge-open circuit voltage curve is equal to or greater than a predetermined value, the estimation necessity determination part determines that it is not necessary to estimate the degradation states of the individual unit cells, and when the degree of matching between the first state of charge-open circuit voltage curve and the second state of charge-open circuit voltage curve is less than a predetermined value, the estimation necessity determination part determines that it is necessary to estimate the degradation states of the individual unit cells.

<Aspect 11>

The device according to any one of aspects 8 to 10, wherein the selection part calculates the degree of matching of the actual state of charge-open circuit voltage curve of the all-solid-state lithium secondary battery from a pre-established map of state of charge-open circuit voltage curves of the all-solid-state lithium secondary battery according to the method of least squares, and/or the estimation necessity determination part calculates the degree of matching between the first state of charge-open circuit voltage curve and the second state of charge-open circuit voltage curve according to the method of least squares.

<Aspect 12>

The device according to any one of aspects 8 to 11, wherein the plurality of unit cells connected in series form a bipolar-type laminated battery.

<Aspect 13>

The device according to any one of aspects 8 to 12, wherein the unit cells comprise a positive electrode current collector layer, a positive electrode active material layer comprising a nickel-cobalt-manganese-based positive electrode active material, a solid electrolyte layer, a negative electrode active material layer, and a negative electrode current collector layer laminated in this order.

<Aspect 14>

A system for controlling the charging and discharging of an all-solid-state lithium secondary battery comprising a plurality of unit cells connected in series, the system comprising:

the device according to any one of aspects 8 to 13, and a voltage controller for obtaining the degradation state of a unit cell which is most deteriorated based on the degradation states of the individual unit cells estimated by the estimation part of the device, and determining a charging upper limit voltage and a discharging lower limit voltage of the all-solid-state lithium secondary battery in accordance with the thus-obtained degradation state of the unit cell which is most deteriorated.

Advantageous Effects of Invention

According to the present disclosure, the degradation states of individual unit cells of an all-solid-state lithium secondary battery comprising a plurality of unit cells connected in series can be estimated even under total voltage monitoring.

Furthermore, according to the present disclosure, at least one of a charging upper limit voltage and a discharging lower limit voltage of an all-solid-state lithium secondary battery can be determined based on the estimated degradation states of the individual unit cells, whereby progression of the degradation of the all-solid-state lithium secondary battery can be prevented.

BRIEF DESCRIPTION OF DRAWINGS

FIG. 1 is an image showing state of charge-open circuit voltage (SOC-OCV) plot values of all-solid-state lithium secondary unit cells corresponding to different degrees of degradation.

FIG. 2 is an image showing a plurality of predetermined SOC-OCV plot values of a predetermined all-solid-state lithium secondary battery.

FIG. 3(a) to FIG. 3(b) are images when selecting an SOC-OCV curve similar to the actual SOC-OCV curve of the all-solid-state lithium secondary battery from the SOC-OCV curves of pattern 1 and pattern 2. Specifically, FIG. 3(a) is an image when comparing the SOC-OCV curve of pattern 1 with the actual SOC-OCV curve of the all-solid-state lithium secondary battery and FIG. 3(b) is an image when comparing the SOC-OCV curve of pattern 2 with entirety of the actual SOC-OCV curve of the all-solid-state lithium secondary battery.

FIG. 7(a) is an image showing the voltage increase rate curve of an all-solid-state lithium secondary battery using a nickel-cobalt-manganese-based positive electrode active material and FIG. 7(b) is an image showing the voltage increase rate curve of an all-solid-state lithium secondary battery using a spinel-based or olivine-based positive electrode active material.

DESCRIPTION OF EMBODIMENTS

Figure 4:
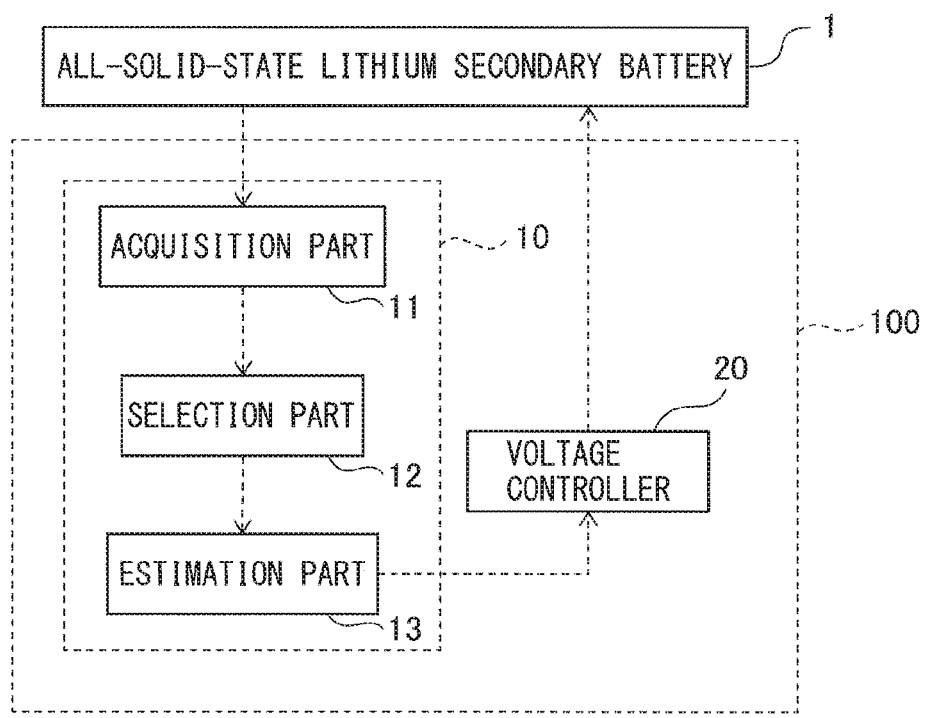
FIG. 4 is a block diagram showing an aspect of a charge and discharge control system of the present disclosure.

The embodiments of the present disclosure will be described in detail below. Note that the present disclosure is not limited to the following embodiments, and various modifications can be made within the scope of the gist of the present disclosure.

<<Method for Estimating Degradation States of Individual Unit Cells of All-Solid-State Lithium Secondary Battery>>

The method for estimating degradation states of individual unit cells of an all-solid-state lithium secondary battery comprises a plurality of unit cells connected in series of the present disclosure comprises the following steps (a) to (c):

(a) calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery, (b) selecting, from a pre-established map of state of charge-open circuit voltage curves of the all-solid-state lithium secondary battery, a state of charge-open circuit voltage curve for which a degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating the state of charge-open circuit voltage curves of the unit cell corresponding to a plurality of different degrees of degradation of the unit cell by the same number as the number of the plurality of unit cells included in the all-solid-state lithium secondary battery, and (c) estimating the degradation states of the individual unit cells based on the selected state of charge-open circuit voltage curve.

<Step (a)>

In step (a), the state of charge and the open circuit voltage of the all-solid-state lithium secondary battery are calculated at a plurality of timings to acquire an actual state of charge-open circuit voltage curve of the all-solid-state lithium secondary battery representing the relationship between the state of charge and the open circuit voltage of the all-solid-state lithium secondary battery.

The state of charge (SOC) and open circuit voltage (OCV) can be used as the indices representing the state of the all-solid-state lithium secondary battery. State of charge (SOC) is a value representing the quantity of electricity charged in the secondary battery, in percentage, wherein the quantity of electricity when the secondary battery is fully charged is 100% and the quantity of electricity when the secondary battery is fully discharged is 0%. Furthermore, open circuit voltage (OCV) is the potential difference between the positive electrode side and the negative electrode side of the secondary battery when current is not flowing.

Examples of the method for calculating the state of charge of the all-solid-state lithium secondary battery include a method of calculating by current accumulation, a method of calculating from current value and voltage value, or the like. However, the method is not limited thereto. When calculating the state of charge, in order to account for the influence of temperature, it is preferable that temperature be taken into account.

The method for calculating the open circuit voltage of the all-solid-state lithium secondary battery is not particularly limited, and can be calculated from, for example, the total current value and voltage value of the all-solid-state lithium secondary battery or calculated from the total resistance value. When calculating the open circuit voltage, in order to account for the influence of temperature, it is preferable that temperature be taken into account.

Thus, it is preferable that the state of charge and open circuit voltage of the all-solid-state lithium secondary battery be calculated at a plurality of timings based on the voltage value, current value, and temperature of the all-solid-state lithium secondary battery to acquire the actual state of charge-open circuit voltage curve of the all-solid-state lithium secondary battery.

By calculating the state of charge and open circuit voltage of the all-solid-state lithium secondary battery at a plurality of timings, the actual state of charge-open circuit voltage curve (also simply referred to as the "SOC-OCV curve") representing the relationship between the state of charge and open circuit voltage of the all-solid-state lithium secondary battery can be acquired. As long as the plurality of timings is at least two times, an SOC-OCV curve can be obtained. The greater the number of times the state of charge and the open circuit voltage of the all-solid-state lithium secondary battery are calculated, the higher the accuracy of the obtained SOC-OCV curve. In consideration of the balance with operation convenience, the plurality of timings may be, for example, 2 times or more, 3 times or more, 4 times or more, 5 times or more, 8 times or more, or 10 times or more, and may be 100 times or less, 80 times or less, 50 times or less, 20 times or less, 10 times or less, or 5 times or less.

<Step (b)>

In step (b), a state of charge-open circuit voltage curve having a degree of matching with the actual state of charge-open circuit voltage curve of the all-solid-state lithium secondary battery acquired in step (a) which is equal to or greater than a predetermined value or which is greatest is selected from a pre-established map of state of charge-open circuit voltage curves of the all-solid-state lithium secondary battery.

Each of the plurality of state of charge-open circuit voltage curves constituting the map is obtained by integrating as many state of charge-open circuit voltage curves of the unit cell corresponding to a plurality of different degrees of degradation of the unit cell as the number of the plurality of unit cells included in the all-solid-state lithium secondary battery.

A plurality of SOC-OCV curves corresponding to different degrees of degradation of a single all-solid-state lithium secondary unit cell are acquired in advance. The different degrees of degradation can be suitably determined from 0% (for example, when brand new) or more to 100% (for example, when fully deteriorated) or less. Furthermore, the starting point of the degrees of degradation is not limited to only 0%, but may be from 1%, 2%, 3%, 4%, or 5%. The end point of the degrees of degradation is not limited to only 100% and may be to 99%, 98%, 97%, 96%, 95%, or 90%.

For example, FIG. 1 is an image showing the SOC-OCV plot values of an all-solid-state lithium secondary battery corresponding to a plurality of different degrees of degradation. Note that the SOC-OCV curve can be drawn from the SOC-OCV plot values.

A number of these SOC-OCV curves corresponding to different degrees of degradation of a unit cell acquired in advance equal to the number of unit cells present in the all-solid-state lithium secondary battery as the target for degradation state estimation are combined. By combining a plurality of the SOC-OCV curves corresponding to different degrees of degradation of a unit cell in this way, the plurality of obtained SOC-OCV curves form a pre-established state of charge-open circuit voltage curve map of the all-solid-state lithium secondary battery.

For example, FIG. 2 is an image showing the entirety of a plurality of predetermined SOC-OCV maps when the all-solid-state lithium secondary battery, which is the target of degradation state estimation, includes three unit cells connected in series, and the unit cell SOC-OCV map shown in FIG. 1 as described above is used. Specifically, for example, pattern 1 of the SOC-OCV plot values of a predetermined all-solid-state lithium secondary battery, is a combination of the OSC-OCV plot values of unit cells having "a degradation degree of 0%", "a degradation degree of 0%", and "a degradation degree of 10%". Furthermore, pattern 2 of the SOC-OCV plot values of a predetermined all-solid-state lithium secondary battery is a combination of the SOC-OCV plot values of unit cells having "a degradation degree of 0%", "a degradation degree of 0%", and "a degradation degree of 30%". Thus, patterns of the SOC-OCV plot values of a plurality of predetermined all-solid-state lithium secondary batteries can be obtained.

A plurality of SOC-OCV curves corresponding to differing degrees of degradation, i.e., a pre-established map of the state of charge-open circuit voltage curves of the all-solid-state lithium secondary battery, can be obtained based on the patterns of the SOC-OCV plot values of the predetermined all-solid-state lithium secondary batteries. Further, a state of charge-open circuit voltage curve having a degree of matching with the actual state of charge-open circuit voltage curve of the all-solid-state lithium secondary battery which is greater than or equal to a predetermined value or which is greatest is selected from the pre-established map of the state of charge-open circuit voltage curves of the all-solid-state lithium secondary battery.

For example, FIG. 3(a) to FIG. 3(b) are images showing when a state of charge-open circuit voltage curve having a degree of matching with the actual SOC-OCV curve of the all-solid-state lithium secondary battery which is equal to or greater than a predetermined value or which is greatest is selected from the map shown in FIG. 2 including the SOC-OCV curve obtained from pattern 1 of the plot values of a predetermined all-solid-state lithium secondary battery and the SOC-OCV curve obtained from pattern 2 of the plot values of a predetermined all-solid-state lithium secondary battery.

FIG. 3(a) is an image when the SOC-OCV curve obtained from pattern 1 is compared with the actual SOC-OCV curve of the all-solid-state lithium secondary battery and FIG. 3(b) is an image when the SOC-OCV curve obtained from pattern 2 is compared with the actual SOC-OCV curve of the all-solid-state lithium secondary battery.

Note that the lower curves (the solid lines and dashed lines) of FIGS. 3(a) and (b) are the SOC-OCV curves of the predetermined unit cells corresponding to the plurality of different degrees of degradation of the unit cells and are the SOC-OCV curves of the unit cells for the respective degrees of degradation, which are obtained from the SOC-OCV plot values of the unit cells for the respective degrees of degradation shown in FIG. 1. More specifically, the lower solid line of FIG. 3(a) is the SOC-OCV curve of a unit cell having a degree of degradation of 10%, the lower dashed line of FIG. 3(a) is the SOC-OCV curve of a unit cell having a degree of degradation of 0%, the lower solid line of FIG. 3(b) is the SOC-OCV curve of a unit cell having a degree of degradation of 30%, and the lower dashed line of FIG. 3(b) is the SOC-OCV curve of a unit cell having a degree of degradation of 0%.

Furthermore, the dashed lines in the upper curves of FIGS. 3(a) and (b) are pre-established maps of SOC-OCV curves of the all-solid-state lithium secondary battery obtained by integrating as many unit cell SOC-OCV curves as the number of unit cells (three in this example). More specifically, the dashed line in the upper curve of FIG. 3(a) is the pre-established SOC-OCV curve of the all-solid-state lithium secondary battery obtained from pattern 1 of the SOC-OCV plot values of a predetermined all-solid-state lithium secondary battery shown in FIG. 2, i.e., by combining the SOC-OCV plot values of unit cells having "a degree of degradation of 0%", "a degree of degradation of 0%", and "a degree of degradation of 10%", and the dashed line in the upper curve of FIG. 3(b) is a pre-established SOC-OCV curve of the all-solid-state lithium secondary battery obtained from pattern 2 of the SOC-OCV plot values of a predetermined all-solid-state lithium secondary battery shown in FIG. 2, i.e., by combining the SOC-OCV plot values of unit cells having "a degree of degradation of 0%", "a degree of degradation of 0%", and "a degree of degradation of 30%". Furthermore, the solid lines in the upper curves of FIGS. 3(a) and (b) are the actual SOC-OCV curves of the all-solid-state lithium secondary battery acquired in step (a).

In this example, the SOC-OCV curve obtained from pattern 2 shown in FIG. 3(b) exactly matches the actual SOC-OCV curve of the all-solid-state lithium secondary battery. Thus, as can be understood from the comparison between FIG. 3(a) and FIG. 3(b), the degree of matching of the SOC-OCV curve obtained from pattern 2 with the actual SOC-OCV curve of the all-solid-state lithium secondary battery is greatest. In this case, the SOC-OCV curve obtained from pattern 2 may be selected.

Note that in FIG. 3(a) to FIG. 3b), an SOC-OCV map having only two patterns is shown. In practice, an SOC-OCV map having more than two patterns may be used, as shown in the image of FIG. 2, and the number of patterns can be suitably set based on a predetermined degree of degradation and the number of unit cells included in the all-solid-state lithium secondary battery targeted for estimation.

Furthermore, though the SOC-OCV curve obtained from pattern 2 shown in FIG. 3(b) completely matched the actual SOC-OCV curve of the all-solid-state lithium secondary battery in the aforementioned example, in the estimation of the present disclosure, the degree of matching with the actual SOC-OCV curve of the all-solid-state lithium secondary battery can be a value greater than or equal to a predetermined value, or can be the degree of matching which is greatest.

The predetermined value of the degree of matching can be calculated by the method of least squares as the degree of matching with the actual all-solid-state lithium secondary battery from the pre-established map of state of charge-open circuit voltage curves of the all-solid-state lithium secondary battery. When the method of least squares is used, the smaller the variable R shown in the following equation, the larger the degree of matching.

$$R = \left\{ \sum_{m=1}^{l} (\Delta V(SOC_m))^2 \right\}^{1/2} \quad \text{[Math 1]}$$

where $\Delta V$ represents the difference in OCV with respect to the same SOC value between the two curves to be compared.

<Step (c)>

In step (c), the degradation states of the individual unit cells of the all-solid-state lithium secondary battery are estimated based on the selected SOC-OCV curve. In other words, the degradation states of the individual unit cells of the all-solid-state lithium secondary battery can be estimated from the pre-established SOC-OCV curve map of the all-solid-state lithium secondary battery when the degree of matching with the actual SOC-OCV curve of the all-solid-state lithium secondary battery acquired in step (a) is equal to or greater than a predetermined value or is greatest.

For example, in the aforementioned example, the SOC-OCV curve obtained from pattern 2 shown in FIG. 3(b) was selected. The SOC-OCV curve obtained from pattern 2 is an SOC-OCV curve obtained from the combination of the SOC-OCV curve plot values of unit cells having "a degradation degree of 0%", "a degradation degree of 0%", and "a degradation degree of 30%". Thus, it can be estimated that the all-solid-state lithium secondary battery made target of the degradation state estimation includes a unit cell having a degradation degree of 0%, a unit cell having a degradation degree of 0%, and a unit cell having a degradation degree of 30%.

Thus, the degradation state of the most deteriorated unit cell can be obtained based on the estimated degradation states of the individual unit cells, and at least one of the charging upper limit voltage and the discharging lower limit voltage of the all-solid-state lithium secondary battery can be determined depending on the thus-obtained degradation state of the most deteriorated unit cell.

In other words, by estimating the degradation state of each individual unit cell of an all-solid-state lithium battery, the degradation state of the most deteriorated unit cell can be understood. In a voltage control method or the like, which will be described later, at least one of the charging upper limit voltage and the discharging lower limit voltage of the all-solid-state lithium secondary battery can be determined as necessary, depending on the degradation state of the most deteriorated unit cell.

Furthermore, in the present disclosure, the following steps (i) and (ii) can be included after the aforementioned step (c). As a result, after estimating the degradation states of the individual unit cells of the all-solid-state lithium secondary battery, it can be determined whether or not it is necessary to again estimate the degradation states.

<Step (i)>

In step (i), the state of charge and open circuit voltage of the all-solid-state lithium secondary battery are calculated at a plurality of timings to acquire the actual state of charge-open circuit voltage curve of the all-solid-state lithium secondary battery. Since this step can be performed in the same manner as step (a) described above, a description therefor has been omitted. Note that, in the following step (ii), when it is necessary to again estimate the degradation states of the individual unit cells by the aforementioned method, the actual state of charge-open circuit voltage curve of the all-solid-state lithium secondary battery acquired in step (i) can be used as the actual state of charge-open circuit voltage curve of the all-solid-state lithium secondary battery in the subsequent step (a).

<Step (ii)>

In step (ii), (ii-1) when the degree of matching between the actual state of charge-open circuit voltage curve of the all-solid-state lithium secondary battery acquired in step (a) above and the actual state of charge-open circuit voltage curve of the all-solid-state lithium secondary battery acquired in step (i) is equal to or greater than a predetermined value, the degradation states of the individual unit cells are not again estimated by the above method, and (ii-2) when the degree of matching between the actual state of charge-open circuit voltage curve of the all-solid-state lithium secondary battery acquired in step (a) above and the actual state of charge-open circuit voltage curve of the all-solid-state lithium secondary battery acquired in step (i) is less than the predetermined value, the degradation states of the individual unit cells are again estimated by the above method.

The degree of matching being "equal to or greater than a predetermined value" means that the degree of degradation of the all-solid-state lithium secondary battery due to usage after estimation of the degradation states of the individual unit cells is not significantly large, and thus, it is not necessary to again estimate the degradation states of the individual unit cells. Furthermore, the degree of matching being "less than a predetermined value" means that the degree of degradation of the all-solid-state lithium secondary battery due to usage after the estimation of the degradation states of the individual unit cells is significantly large, and thus, it is necessary to again estimate the degradation states of the individual unit cells.

The predetermined value can be appropriately determined. Furthermore, the degree of matching between the actual SOC-OCV curve of the all-solid-state lithium secondary battery acquired in step (a) and the actual SOC-OCV curve of the all-solid-state lithium secondary battery acquired in step (i) can be calculated by the method of least squares.

In step (ii), when it is not necessary to again estimate the degradation states of the individual unit cells, i.e., in the case of (ii-1), repeat performance of the estimation of the degradation states of the individual unit cells can be omitted, and usage of the all-solid-state lithium secondary battery can continue based on the prior-estimated degradation states of the individual unit cells. Note that, the interval in which the all-solid-state lithium secondary battery can be used based on the estimated degradation states of the individual unit cells is not particularly limited and can be appropriately determined by a person skilled in the art.

In step (ii), when the degradation states of the individual unit cells of the all-solid-state lithium secondary battery are again estimated, i.e., in the case of (ii-2), the degradation states of the individual unit cells can be estimated according to steps (b) and (c) described above.

The present disclosure can further provide an estimation device for estimating the degradation states of the individual unit cells of the all-solid-state lithium secondary battery, which will be described in detail below.

<<Estimation Device for Estimating Degradation States of Individual Unit Cells of All-Solid-State Lithium Secondary Battery>>

The estimation device of the present disclosure for estimating the degradation states of the individual unit cells of an all-solid-state lithium secondary battery comprising a plurality of unit cells connected in series comprises the following:

a state of charge-open circuit voltage curve acquisition part for calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery, a selection part for selecting, from a pre-established map of state of charge-open circuit voltage curves of the all-solid-state lithium secondary battery, a state of charge-open circuit voltage curve for which the degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating as many state of charge-open circuit voltage curves of a unit cell corresponding to a plurality of different degrees of degradation of the unit cell as the number of the plurality of unit cells included in the all-solid-state lithium secondary battery, and an estimation part for estimating the degradation states of the individual unit cells based on the selected state of charge-open circuit voltage curve.

FIG. 4 is a block diagram showing an aspect of the charge and discharge control system of the present disclosure. The charge and discharge control system 100 of the all-solid-state lithium secondary battery 1 comprises the estimation device 10 of the present disclosure for estimating the degradation state of the all-solid-state lithium secondary battery 1. However, the estimation device for estimating the degradation states of the individual unit cells is not limited to application to a charge and discharge control system of an all-solid-state lithium secondary battery, but can be applied to any battery related system in accordance with the use or application thereof.

The estimation device 10 of the present disclosure for estimation of the degradation state of the all-solid-state lithium secondary battery 1 shown in FIG. 4 comprises:

a state of charge-open circuit voltage curve acquisition part 11 for calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery, a selection part 12 for selecting, from a pre-established map of state of charge-open circuit voltage curves of the all-solid-state lithium secondary battery, a state of charge-open circuit voltage curve for which the degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating as many state of charge-open circuit voltage curves of a unit cell corresponding to a plurality of different degrees of degradation of the unit cell as the number of the plurality of unit cells included in the all-solid-state lithium secondary battery, and an estimation part 13 for estimating the degradation states of the individual unit cells based on the selected state of charge-open circuit voltage curve.

<State of Charge-Open Circuit Voltage Curve Acquisition Part>

The state of charge-open circuit voltage curve acquisition part calculates, at a plurality of timings, the state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery. The specific method for acquiring the state of charge-open circuit voltage curve of the all-solid-state lithium secondary battery is not particularly limited and may be, for example, the method exemplified in step (a) described above.

In a preferred embodiment for acquiring the state of charge-open circuit voltage curve of the all-solid-state lithium secondary battery, the state of charge-open circuit voltage curve acquisition part calculates the state of charge and open circuit voltage of the all-solid-state lithium secondary battery at a plurality of timings based on the voltage value, current value, and temperature of the all-solid-state lithium secondary battery to acquire the actual state of charge-open circuit voltage of the all-solid-state lithium secondary battery. In other words, the state of charge-open circuit voltage curve acquisition part preferably includes a voltage value acquisition part, a current value acquisition part, and a temperature acquisition part for measuring all of the voltage amount, current amount, and temperature of the all-solid-state lithium secondary battery.

<Selection Part>

The selection part selects a state of charge-open circuit voltage curve having a degree of matching with the actual state of charge-open circuit voltage curve of the all-solid-state lithium secondary battery which is equal to or greater than a predetermined value or which is greatest from the pre-established map of state of charge-open circuit voltage curves of the all-solid-state lithium secondary battery. Furthermore, the predetermined value of the degree of matching can be appropriately selected. Moreover, the degree of matching between the pre-established SOC-OCV curve of the all-solid-state lithium secondary battery and the actual SOC-OCV curve of the all-solid-state lithium secondary battery can be calculated by the method of least squares.

Each of the plurality of state of charge-open circuit voltage curves constituting the map is obtained by integrating as many state of charge-open circuit voltage curves of the unit cell corresponding to a plurality of different degrees of degradation of the unit cell as the number of the plurality of unit cells included in the all-solid-state lithium secondary battery.

Note that in the selection part, as the specific method for selecting a state of charge-open circuit voltage curve having a degree of matching with the actual state of charge-open circuit voltage curve of the all-solid-state lithium secondary battery which is equal to or greater than a predetermined value or which is greatest from the pre-established map of state of charge-open circuit voltage curves of the all-solid-state lithium secondary battery, for example, the method described regarding step (b) above can be suitably used.

Furthermore, the information of the pre-established map of SOC-OCV curves of the all-solid-state lithium secondary battery may be stored in the selection part or may be separately stored in a storage unit which can exchange data with the selection part.

<Estimation Part>

The degradation states of the individual unit cells are estimated in the estimation part based on the selected state of charge-open circuit voltage curve.

In the estimation part, the degradation state of the most deteriorated unit cell can be understood by estimating the degradation states of the individual unit cells of the all-solid-state lithium secondary battery. If necessary, for example, a voltage controller or the like, which is described later, can determine at least one of a charging upper limit voltage and a discharging lower limit voltage of the all-solid-state lithium secondary battery based on the degradation state of the most deteriorated unit cell.

For example, in the block diagram shown in FIG. 4, which shows an aspect of the charge and discharge control system of the present disclosure, the information on the degradation state of the most deteriorated unit cell estimated in the estimation part 13 can be transmitted to the voltage controller 20. At least one of the charging upper limit voltage and the discharging lower limit voltage of the all-solid-state lithium secondary battery can be determined by the voltage controller 20 based on the information on the degradation state of the mot deteriorated unit cell.

<Estimation Necessity Determination Part>

Furthermore, the estimation device of the present disclosure can further comprise an estimation necessity determination part. Thus, it can be determined whether or not it is necessary for the degradation states to be again estimated after the degradation states of the individual unit cells of the all-solid-state lithium secondary battery have been estimated by the state of charge-open circuit voltage curve acquisition part, the selection part, and the estimation part.

Specifically, the actual state of charge-open circuit voltage curve of the all-solid-state lithium secondary battery used by the aforementioned estimation part for estimating the degradation states of the individual unit cells is set as a first state of charge-open circuit voltage curve. After the estimation part has estimated the degradation states of the individual unit cells, the state of charge-open circuit voltage curve acquisition part acquires a second state of charge-open circuit voltage curve by calculating, at a plurality of timings, the state of charge and open circuit voltage of the all-solid-state lithium secondary battery.

The first state of charge-open circuit voltage curve can be acquired in the state of charge-open circuit voltage curve acquisition part by the method described above regarding step (a).

The second state of charge-open circuit voltage curve can be acquired, after the estimation part has estimated the degradation states of the individual unit cells of the all-solid-state lithium secondary battery, by the method described above regarding step (a).

When the degree of matching between the first state of charge-open circuit voltage curve and the second state of charge-open circuit voltage curve is equal to or greater than a predetermined value, the estimation necessity determination part determines that it is not necessary to estimate the degradation states of the individual unit cells, and when the degree of matching between the first state of charge-open circuit voltage curve and the second state of charge-open circuit voltage curve is less than the predetermined value, the estimation necessity determination part determines that it is necessary to estimate the degradation states of the individual unit cells.

More specifically, when the estimation necessity determination part determines that it is necessary to estimate the degradation states of the individual unit cells, a state of charge-open circuit voltage curve having a degree of matching with the actual state of charge-open circuit voltage curve of the all-solid-state lithium secondary battery which is greater than or equal to a predetermined value or which is greatest is selected by the selection part described above from the pre-established map of state of charge-open circuit voltage curves of the all-solid-state lithium secondary battery, and the degradation states of the individual unit cells are estimated by the estimation part described above based on the selected state of charge-open circuit voltage curve.

The predetermined value of the phrases "equal to or greater than a predetermined value" and "less than a predetermined value" can be appropriately determined. Furthermore, the degree of matching between the actual first state of charge-open circuit voltage curve of the all-solid-state lithium secondary battery and the actual second state of charge-open circuit voltage curve of the all-solid-state lithium secondary battery can be calculated by the method of least squares.

As described above, in the estimation device of the present disclosure, the state of charge-open circuit voltage curve acquisition part and the selection part, and if necessary, additionally the storage unit and the estimation necessity determination part may each comprise an electronic control unit (ECU). Furthermore, the estimation part may comprise, for example, a power control unit (PCU).

<<All-Solid-State Lithium Secondary Battery Control Method and Charge and Discharge Control System>>

The present disclosure can further provide a control method and a system for controlling the charging and discharging of an all-solid-state lithium secondary battery comprising a plurality of unit cells connected in series which uses the method and estimation device for estimating the degradation states of individual unit cells of the aforementioned all-solid-state lithium secondary battery, which are described in detail below.

The method of the present disclosure for controlling an all-solid-state lithium secondary battery comprising a plurality of unit cells connected in series determines at least one of a charging upper limit voltage and a discharging lower limit voltage of the all-solid-state lithium secondary battery based on the degradation states of the individual unit cells estimated in step (c) described above.

The system for controlling the charging and discharging of an all-solid-state lithium secondary battery comprising a plurality of unit cells connected in series of the present disclosure comprises:

the aforementioned estimation device, and a voltage controller for obtaining the degradation state of a unit cell which is most deteriorated based on the degradation states of the individual unit cells estimated by the device of the device, and determining at least one of a charging upper limit voltage and a discharging lower limit voltage of the all-solid-state lithium secondary battery in accordance with the thus-obtained degradation state of the unit cell which is most deteriorated.

For example, FIG. 4 is a block diagram showing an aspect of the system for controlling the charging and discharging of the present disclosure. The system for controlling the charging and discharging 100 of the all-solid-state lithium secondary battery of the present disclosure comprises the estimation device 10 of the present disclosure for estimating the degradation state of the all-solid-state lithium secondary battery 1, and a voltage controller 20. The estimation device 10 comprises a state of charge-open circuit voltage curve acquisition part 11, a selection part 12, and an estimation part 13. The voltage controller 20 determines at least one of the charging upper limit voltage and the discharging lower limit voltage of the all-solid-state lithium secondary battery based on the degradation states of the individual unit cells estimated in the estimation part 13.

Figure 5:
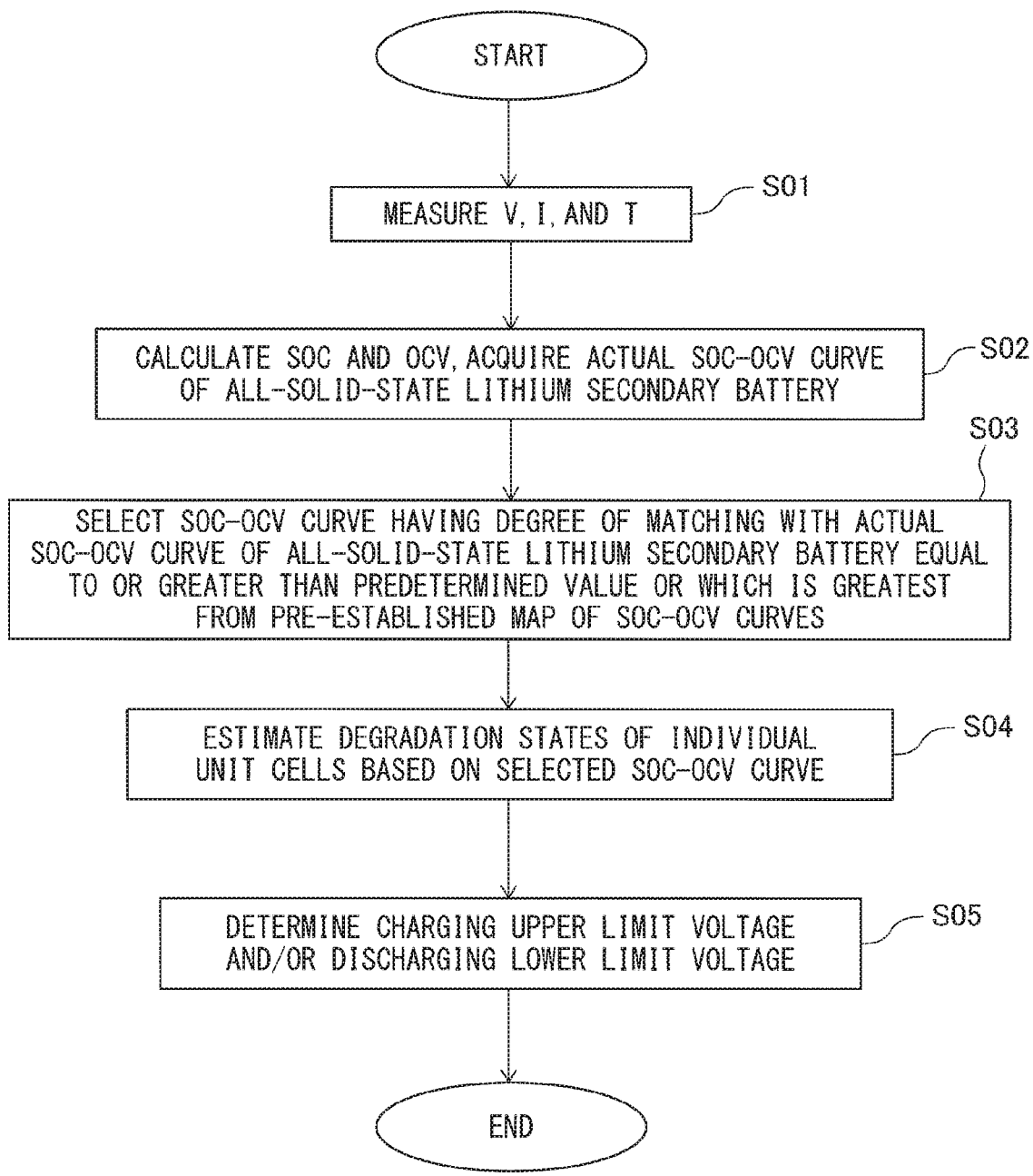
FIG. 5 is a flowchart showing aspects of the control method and charge and discharge control system of the present disclosure.

Furthermore, FIG. 5 is a flowchart showing an aspect of the control method and charging and discharging control system of the all-solid-state lithium secondary battery of the present disclosure.

As shown in FIG. 5, after the control method and system for controlling the charging and discharging of the all-solid-state lithium secondary battery of the present disclosure have started, in step S01, the voltage value acquisition part, current value acquisition part, and temperature acquisition part measure, at a plurality of timings, the voltage value V, the current value I, and the temperature T of the entirety of the all-solid-state lithium secondary battery, respectively.

Note that step S01, in which V, I, and T are measured, is a step for calculating the state of charge and open circuit voltage of the entirety of the all-solid-state lithium secondary battery. As described above, the method for calculated in the state of charge and open circuit voltage of the all-solid-state lithium secondary battery is not limited to a method for calculating based on the current value, voltage value, and temperature.

Next, in step S02, the state of charge and open circuit voltage of the all-solid-state lithium secondary battery are calculated in the state of charge-open circuit voltage curve acquisition part based on the voltage value V, the current value I, and the temperature T, which are obtained by the measurement described above, to acquire the actual state of charge-open circuit voltage curve of the all-solid-state lithium secondary battery (actual SOC-OCV curve). Actual SOC-OCV curve acquisition step S02 corresponds to step (a) described above.

In step S03, a state of charge-open circuit voltage curve having a degree of matching with the actual state of charge-open circuit voltage curve of the all-solid-state lithium secondary battery (actual SOC-OCV curve) which is greater than or equal to a predetermined value or which is greatest is selected in the selection part from a pre-established map of state of charge-open circuit voltage curves of the all-solid-state lithium secondary battery (pre-established SOC-OCV curve map of the all-solid-state lithium secondary battery). Each of the plurality of state of charge-open circuit voltage curves constituting the map is obtained by integrating as many state of charge-open circuit voltage curves of the unit cell corresponding to a plurality of different degrees of degradation of the unit cell as the number of the plurality of unit cells included in the all-solid-state lithium secondary battery. Furthermore, selection step S03 corresponds to step (b) described above.

Thereafter, in step S04, the degradation states of the individual unit cells of the all-solid-state lithium secondary battery are estimated based on the selected state of charge-open circuit voltage curve. Estimation step S04 corresponds to step (c) described above.

Finally, in step S05, the degradation state of the most deteriorated unit cell is determined based on the estimated degradation states of the individual unit cells of the all-solid-state lithium secondary battery, and at least one of the charging upper limit voltage and the discharging lower limit voltage of the all-solid-state lithium secondary battery is determined in accordance with the thus-obtained degradation state of the most deteriorated unit cell. The determination method is not particularly limited and can be suitably selected by a person skilled in the art.

For example, in selection step S03, the degradation states of the individual unit cells are estimated from the selected SOC-OCV curve, and a lower limit value of the capacity of the all-solid-state lithium secondary battery is calculated based on the degradation state of the most deteriorated unit cell. The upper limit value of SOC at the time of charging/discharging is appropriately set based on this capacity lower limit value, and the all-solid-state lithium secondary battery is used.

Furthermore, though not illustrated, the control method and system for controlling the charging and discharging of an all-solid-state lithium secondary battery can further comprise an estimation necessity determination part. In the estimation necessity determination part, after the all-solid-state lithium battery has been operated for a predetermined interval after the degradation states of the individual unit cells of the all-solid-state lithium battery have been estimated in accordance with the methods of steps (i) and (ii) described above, it can be determined whether or not it is necessary to again estimate the degradation states.

Thus, according to the present disclosure, the degradation states of the individual unit cells of an all-solid-state lithium secondary battery comprising a plurality of unit cells connected in series can be estimated even under total voltage monitoring. Furthermore, at least one of the charging upper limit voltage and the discharging lower limit voltage of the all-solid-state lithium secondary battery can be determined based on the estimated degradation states of the individual unit cells, whereby progression of the degradation of the all-solid-state lithium secondary battery can be prevented.

Figure 6:
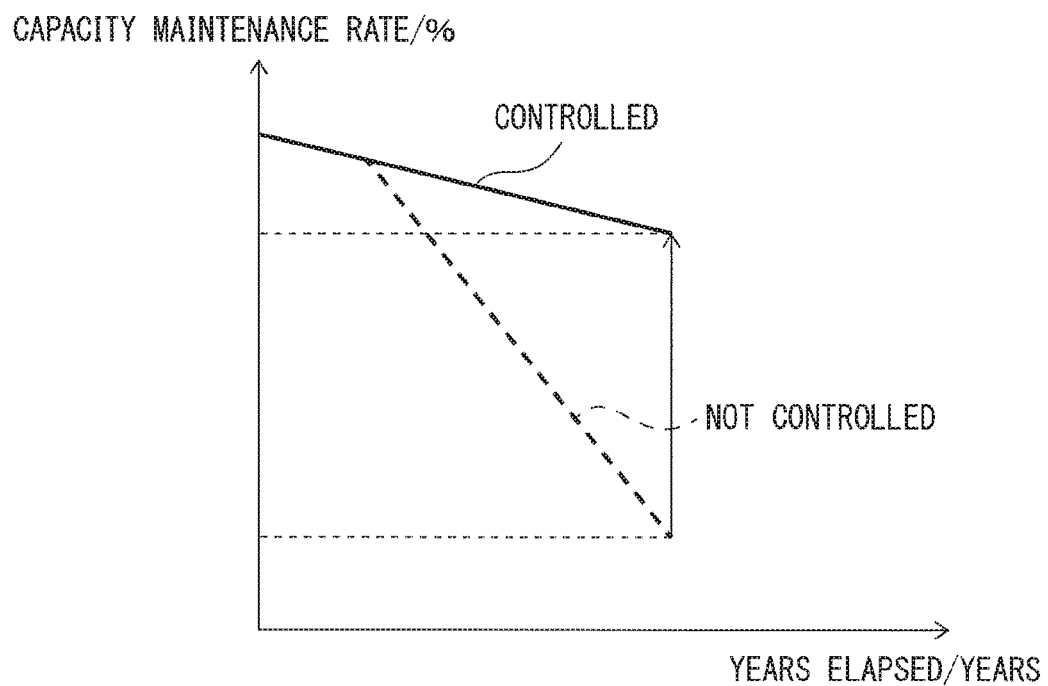
FIG. 6 is an image showing the effects of the control method and charge and discharge control system of the present disclosure.

For example, FIG. 6 is an image showing the results of the control method and system for controlling charging and discharging of the present disclosure. In FIG. 6, the dashed line represents the results of continued use of the all-solid-state lithium secondary battery without estimating the degradation state of the battery, whereby the degradation of the deteriorated unit cells was further promoted, which resulted in a significant decrease in the capacity of the battery. Conversely, the solid line represents the results of continued use of the all-solid-state lithium secondary battery when the degradation states of the individual unit cells were estimated using the method of the present disclosure and at least one of the charging upper limit voltage and discharging lower limit voltage were determined based on the estimated degradation states of the individual unit cells, whereby progression of the degradation of the all-solid-state lithium secondary battery was prevented.

<<Configuration of the All-Solid-State Lithium Secondary Battery>>

The all-solid-state lithium secondary battery of the present disclosure comprises a plurality of unit cells connected in series. The unit cells can also be referred to as all-solid-state lithium secondary unit cells.

The unit cells of the present disclosure are not particularly limited and may be selected in accordance with the intended use or application thereof. For example, each unit cell can be configured by laminating a positive electrode current collector layer, a positive electrode active material layer, a solid electrolyte layer, a negative electrode active material layer, and a negative electrode current collector layer in this order.

Furthermore, from the viewpoint of better exerting the effect of the present disclosure, each unit cell preferably comprises a positive electrode current collector layer, a positive electrode active material layer comprising a nickel-cobalt-manganese-based positive electrode active material, a solid electrolyte layer, a negative electrode active material layer, and a negative electrode current collector layer laminated in this order.

Further, in the present disclosure, the plurality of unit cells connected in series preferably form a bipolar-type laminated battery. A bipolar-type laminated battery is a battery in which a laminate comprising a current collector layer, a positive electrode active material layer disposed on one surface of the current collector layer, and a negative electrode active material layer disposed on the other side of the current collector layer are laminated via electrolyte layers.

<Current Collector Layer>

The current collector layers are laminated on the surfaces of the active material layers opposite the surfaces of the active material layers on which the electrolyte layer is laminated. When the active material layer is the positive electrode active material layer, the current collector laminated thereon is a positive electrode current collector layer, and when the active material layer is the negative electrode active material layer, the current collector layer laminated thereon is the negative electrode current collector layer. Furthermore, when the all-solid-state battery laminate is of a bipolar-type, a positive electrode/negative electrode current collector layer can be used. "Positive electrode/negative electrode current collector layer" means a current collector layer which can serve as either electrode (positive electrode or negative electrode), i.e., in the case of a bipolar-type all-solid-state battery laminate, "positive electrode/negative electrode current collector layer" means a current collector layer which is shared between the positive electrode active material layer and the negative electrode active material layer.

The material constituting the positive electrode current collector layer, the negative electrode current collector layer, or the positive electrode/negative electrode current collector layer is not particularly limited and can be a metal element such as, for example, silver, copper, gold, aluminum, nickel, iron, stainless steel (SUS), or titanium, or alloys thereof. From the viewpoint of chemical stability and the like, it is preferable that an aluminum current collector layer be used as the positive electrode current collector layer, it is preferable that a copper current collector layer be used as the negative electrode current collector layer, and it is preferable that SUS be used as the positive electrode/negative electrode current collector layer.

The forms of the current collector layers are not particularly limited, and can be, for example, a foil, a plate, a mesh, or the like.

<Positive Electrode Active Material Layer>

The positive electrode active material layer comprises at least a positive electrode active material and preferably further comprises a solid electrolyte, which is described later. In addition thereto, additives which are used in the positive electrode active material layer of all-solid-state batteries such as, for example, a conductive aid or a binder, can be included in accordance with the intended use or application thereof.

(Positive Electrode Active Material)

The material of the positive electrode active material used in the present disclosure is not particularly limited. For example, nickel-cobalt-manganese-based compounds (also referred to as "NMC-based compounds"), Mn spinel-based compounds, NiMn spinel-based compounds, olivine-based compounds, or sulfides can be used as the positive electrode active material.

More specifically, the positive electrode active material may be, for example, lithium cobalt oxide ($LiCoO_2$), lithium nickel oxide ($LiNiO_2$), lithium manganate ($LiMn_2O_4$), $LiCo_{1/3}Ni_{1/3}Mn_{1/3}O_2$, or a heterogeneous-element-substituted Li-Mn spinel represented by $Li_{1+x}Mn_{2-x-y}M_yO_4$ (wherein M is at least one metal element selected from Al, Mg, Co, Fe, Ni and Zn), or a sulfide-based compound ($Li_xS$ or $Li_xMS_2$ (wherein M is Fe, Ti, etc.)). However, the material of the positive electrode active material layer is not limited thereto.

From among the positive electrode active materials described above, in all-solid-state lithium secondary batteries using an NCM-based positive electrode active material comprising a deteriorated unit cell and in all-solid-state lithium secondary batteries using a spinel-based or olivine-based positive electrode active material comprising a deteriorated unit cell, when the deteriorated unit cell is overcharged (i.e., SOC >100% charge), the rate of increase in voltage of the all-solid-state lithium secondary battery using an NCM-based positive electrode active material is relatively gradual.

Figure 7A:
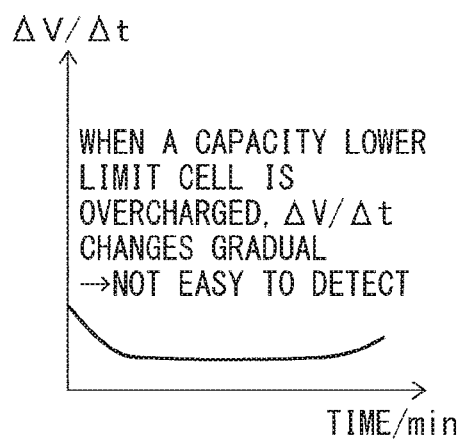
FIG. 7(a) to FIG. 7(b) are images showing a voltage increase rate curve when a deteriorated unit cell is overcharged. Specifically.
Figure 7B:
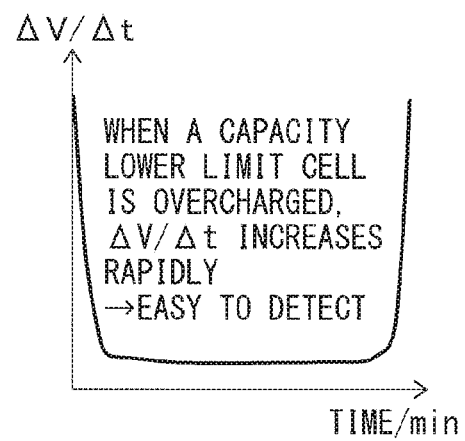

For example, it can be understood that when a deteriorated unit cell is overcharged, the curve of the rate of increase in voltage of the all-solid-state lithium secondary battery using an NCM-based positive electrode active material shown in FIG. 7($a$) is more gradual than the curve of the rate of increase in voltage of the all-solid-state lithium secondary battery using a spinel-based or olivine-based positive electrode active material shown in FIG. 7($b$). This means that the all-solid-state lithium secondary battery using a spinel-based or olivine-based positive electrode active material shown in FIG. 7($b$) can be used in the method for estimating the state of charge of Patent Literature 1 described above. Conversely, since the all-solid-state lithium secondary battery using an NCM-based positive electrode active material has a relatively gradual voltage increase rate as compared to all-solid-state secondary batteries using a spinel- or olivine-based positive electrode active material, when means like that of Patent Literature 1 are used, even if a single unite cell is deteriorated, the voltage increase of the deteriorated unit cell is obscured by the voltage behavior of the other unit cells, and it is difficult to detect the voltage increase of the deteriorated unit cell. In other words, this means that, even under total voltage monitoring, it is difficult to apply the state of charge estimation method of Patent Literature 1 described above to all-solid-state lithium secondary batteries using an NCM-based positive electrode active material.

However, the estimation method, estimation device, control method, and control system of the present application can be applied to all-solid-state lithium secondary batteries using an NCM-based positive electrode active material. In other words, the effect of the present disclosure can be more remarkably exerted by using an NCM-based positive electrode active material.

(Conductive Aid)

The conductive aid is not particularly limited, and any known conductive aid can be used. For example, the conductive aid may be a carbon material, such as VGCF (vapor grown carbon fiber) or carbon nanofibers, or may be a metal material. However, the conductive aid is not limited thereto.

(Binder)

The binder is not particularly limited, and any known binder can be used. For example, the binder may be a material such as polyvinylidene fluoride (PVdF), carboxymethyl cellulose (CMC), butadiene rubber (BR), styrene butadiene rubber (SBR), or combinations thereof. However, the binder is not limited thereto.

<Solid Electrolyte Layer>

The solid electrolyte layer includes at least a solid electrolyte. The solid electrolyte is not particularly limited and any material commonly used as the solid electrolyte in all-solid-state batteries can be used. For example, the solid electrolyte may be a sulfide solid electrolyte, oxide solid electrolyte, or polymeric electrolyte. However, the solid electrolyte is not limited thereto.

(Sulfide Solid Electrolyte)

Examples of the sulfide solid electrolyte include $Li_2S$-$SiS_2$, $LiI$-$Li_2S$-$SiS_2$, $LiI$-$Li_2S$-$P_2S_5$, $LiI$-$LiBr$-$Li_2S$-$P_2S_5$, $Li_2S$-$P_2S_5$-$LiI$-$LiBr$, $Li_2S$-$P_2S_5$-$GeS_2$, $LiI$-$Li_2S$-$P_2O_5$, $LiI$-$Li_3PO_4$-$P_2S_5$, and $Li_2S$-$P_2S_5$; sulfide-based crystalline solid electrolytes, such as $Li_{10}GeP_2S_{12}$, $Li_7P_3S_{11}$, $Li_3PS_4$, and $Li_{3.25}P_{0.75}S_4$; and combinations thereof.

(Oxide Solid Electrolyte)

Examples of the oxide solid electrolyte include $Li_7La_3Zr_2O_{12}$, $Li_{7-x}La_3Zr_{1-x}Nb_xO_{12}$, $Li_{7-3x}La_3Zr_2Al_xO_{12}$, $Li_{3x}La_{2/3-x}TiO_3$, $Li_{1+x}Al_xTi_{2-x}(PO_4)_3$, $Li_{1+x}Al_xGe_{2-x}(PO_4)_3$, $Li_3PO_4$, and $Li_{3+x}PO_{4-x}N_x$ (LiPON). However, the oxide solid electrolyte is not limited to these materials.

(Polymeric Electrolyte)

Examples of the polymeric electrolyte include polyethylene oxide (PEO), polypropylene oxide (PPO), and copolymers thereof. However, the polymeric electrolyte is not limited thereto.

The solid electrolyte may be a glass or a crystallized glass (glass ceramic).

Furthermore, in addition to the above-described solid electrolytes, the solid electrolyte layer may include a binder as necessary. Specific examples thereof are the same as the "binders" described above for the "positive electrode active material layer", and thus, a description thereof has been omitted.

<Negative Electrode Active Material Layer>

The negative electrode active material layer includes at least a negative electrode active material and preferably further includes a solid electrolyte as described above. In addition thereto, depending on the purpose or application thereof, for example, additives commonly used in the negative electrode active material layer of all-solid-state batteries, such as a conductive aid or binder, can be included.

(Negative Electrode Active Material)

The material of the negative electrode active material used in the present disclosure is not particularly limited. The material is preferably capable of occluding and releasing metal ions such as lithium ions. For example, the negative electrode active material may be a metal such as Li, Sn, or Si, an alloy of lithium and titanium, or a carbon material such as hard carbon, soft carbon, or graphite. However, the material of the negative electrode active material layer is not limited thereto.

(Additives)

Regarding the solid electrolyte and other additives such as the conductive aid and binder used in the negative electrode active material layer, those described above in the sections "positive electrode active material layer" and "solid electrolyte layer" can be appropriately used.

REFERENCE SIGNS LIST 1 all-solid-state lithium secondary battery
10 estimation device for estimating degradation states of individual unit cells of all-solid-state lithium secondary battery
11 state of charge-open circuit voltage curve acquisition part
12 selection part
13 estimation part
20 voltage controller
100 charge and discharge control system

The invention claimed is:

1. A method for estimating degradation states of individual unit cells of an all-solid-state lithium secondary battery comprising a plurality of unit cells connected in series, the method comprising the following steps (a) to (c):
   (a) calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery,
   (b) selecting, from a pre-established map of state of charge-open circuit voltage curves of the all-solid-state lithium secondary battery, a state of charge-open circuit voltage curve for which a degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating as many state of charge-open circuit voltage curves of the unit cell corresponding to a plurality of different degrees of degradation of the unit cell as the number of the plurality of unit cells included in the all-solid-state lithium secondary battery, and
   (c) estimating the degradation states of the individual unit cells based on the selected state of charge-open circuit voltage curve.

2. The method according to claim 1, wherein in step (a), the state of charge and open circuit voltage of the all-solid-state lithium secondary battery are calculated, at the plurality of timings, based on a voltage value, a current value, and a temperature of the all-solid-state lithium secondary battery to acquire the actual state of charge-open circuit voltage curve of the all-solid-state lithium secondary battery.

3. The method according to claim 1, comprising the following steps (i) and (ii) after step (c);
   (i) calculating, at a plurality of timings, the state of charge and open circuit voltage of the all-solid-state lithium secondary battery to acquire the actual state of charge-open circuit voltage curve of the all-solid-state lithium secondary battery, and
   (ii) (ii-1) not again estimating the degradation states of the individual unit cells by the method according to claim 1 when a degree of matching between the actual state of charge-open circuit voltage curve of the all-solid-state lithium secondary battery acquired in step (a) and the actual state of charge-open circuit voltage curve of the all-solid-state lithium secondary battery acquired in step (i) is equal to or greater than a predetermined value, and (ii-2) again estimating the degradation states of the individual unit cells by the method according to claim 1 when the degree of matching between the actual state of charge-open circuit voltage curve of the all-solid-state lithium secondary battery acquired in step (a) and the actual state of charge-open circuit voltage curve of the all-solid-state lithium secondary battery acquired in step (i) is less than the predetermined value.

4. The method according to claim 1, wherein at least one of:
   the degree of matching of the actual state of charge-open circuit voltage curve of the all-solid-state lithium secondary battery from the pre-established map of the state of charge-open circuit voltage curves of the all-solid-state lithium secondary battery, and
   the degree of the matching between the actual state of charge-open circuit voltage curve of the all-solid-state lithium secondary battery acquired in step (a) and the actual state of charge-open circuit voltage curve of the all-solid-state lithium secondary battery acquired in step (i)
   is calculated according to the method of least squares.

5. The method according to claim 1, wherein the plurality of unit cells connected in series form a bipolar-type laminated battery.

6. The method according to claim 1, wherein the unit cells comprise a positive electrode current collector layer, a positive electrode active material layer comprising a nickel-cobalt-manganese-based positive electrode active material, a solid electrolyte layer, a negative electrode active material layer, and a negative electrode current collector layer laminated in this order.

7. A method for controlling an all-solid-state lithium secondary battery including a plurality of unit cells connected in series, the method comprising obtaining the degradation state of a unit cell which is most deteriorated based on the degradation states of the individual unit cells estimated in step (c) of the method according to claim 1, and determining at least one of a charge upper limit voltage and a discharge lower limit voltage of the all-solid-state lithium battery in accordance with the thus-obtained degradation state of the unit cell which is most deteriorated obtained.

8. An estimation device for estimating the degradation states of individual unit cells of an all-solid-state lithium secondary battery comprising a plurality of unit cells connected in series, the device comprising:
   a state of charge-open circuit voltage curve acquisition part for calculating, at a plurality of timings, a state of charge and open circuit voltage of the all-solid-state lithium secondary battery to acquire an actual state of charge-open circuit voltage curve of the all-solid-state lithium secondary battery representing the relationship between the state of charge and the open circuit voltage of the all-solid-state lithium secondary battery,
   a selection part for selecting, from a pre-established map of state of charge-open circuit voltage curves of the all-solid-state lithium secondary battery, a state of charge-open circuit voltage curve for which the degree of matching with the actual state of charge-open circuit voltage curve of the all-solid-state lithium secondary battery is equal to or greater than a predetermined value or is greatest, wherein each of the plurality of state of charge-open circuit voltage curves constituting the map is obtained by integrating as many state of charge-open circuit voltage curves of the unit cell corresponding to a plurality of different degrees of degradation of the unit cell as the number of the plurality of unit cells included in the all-solid-state lithium secondary battery, and
   an estimation part for estimating the degradation states of the individual unit cells based on the selected state of charge-open circuit voltage curve.

9. The device according to claim 8, wherein the state of charge-open circuit voltage curve acquisition part calculates, at a plurality of timings, the state of charge and open circuit voltage of the all-solid-state lithium secondary battery based on a voltage value, a current value, and a temperature of the all-solid-state lithium secondary battery at a plurality of timings to acquire the actual state of charge-open circuit voltage curve of the all-solid-state lithium secondary battery.

10. The device according to claim 8, further comprising an estimation necessity determination part, wherein the actual state of charge-open circuit voltage curve of the all-solid-state lithium secondary battery used for estimation of the degradation states of the individual unit cells by the estimation part is a first state of charge-open circuit voltage curve, after the degradation states of the individual unit cells have been estimated by the estimation part, the state of charge-open circuit voltage curve acquisition part calculates, at a plurality of timings, the state of charge and open circuit voltage of the all-solid-state lithium secondary battery to acquire a second state of charge-open circuit voltage curve, and when a degree of matching between the first state of charge-open circuit voltage curve and the second state of charge-open circuit voltage curve is equal to or greater than a predetermined value, the estimation necessity determination part determines that it is not necessary to estimate the degradation states of the individual unit cells, and when the degree of matching between the first state of charge-open circuit voltage curve and the second state of charge-open circuit voltage curve is less than a predetermined value, the estimation necessity determination part determines that it is necessary to estimate the degradation states of the individual unit cells.

11. The device according to claim 8, wherein
the selection part calculates the degree of matching of the actual state of charge-open circuit voltage curve of the all-solid-state lithium secondary battery from a pre-established map of state of charge-open circuit voltage curves of the all-solid-state lithium secondary battery according to the method of least squares, and/or the estimation necessity determination part calculates the degree of matching between the first state of charge-open circuit voltage curve and the second state of charge-open circuit voltage curve according to the method of least squares.

12. The device according to claim 8, wherein the plurality of unit cells connected in series form a bipolar-type laminated battery.

13. The device according to claim 8, wherein the unit cells comprise a positive electrode current collector layer, a positive electrode active material layer comprising a nickel-cobalt-manganese-based positive electrode active material, a solid electrolyte layer, a negative electrode active material layer, and a negative electrode current collector layer laminated in this order.

14. A system for controlling the charging and discharging of an all-solid-state lithium secondary battery comprising a plurality of unit cells connected in series, the system comprising:

the device according to claim 8, and a voltage controller for obtaining the degradation state of a unit cell which is most deteriorated based on the degradation states of the individual unit cells estimated by the estimation part of the device, and determining at least one of a charging upper limit voltage and a discharging lower limit voltage of the all-solid-state lithium secondary battery in accordance with the thus-obtained degradation state of the unit cell which is most deteriorated.

* * * * *